(12) United States Patent
Segawa

(10) Patent No.: US 9,526,167 B2
(45) Date of Patent: Dec. 20, 2016

(54) MANY-UP WIRING SUBSTRATE, WIRING BOARD, AND ELECTRONIC DEVICE

(75) Inventor: Hiroyuki Segawa, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 563 days.

(21) Appl. No.: 13/882,676

(22) PCT Filed: Mar. 30, 2011

(86) PCT No.: PCT/JP2011/058034
§ 371 (c)(1),
(2), (4) Date: Jun. 25, 2013

(87) PCT Pub. No.: WO2012/060121
PCT Pub. Date: May 10, 2012

(65) Prior Publication Data
US 2013/0265727 A1    Oct. 10, 2013

(30) Foreign Application Priority Data

Nov. 2, 2010    (JP) ................................. 2010-246388

(51) Int. Cl.
*H05K 1/18*    (2006.01)
*H05K 1/02*    (2006.01)
(Continued)

(52) U.S. Cl.
CPC ........... *H05K 1/0298* (2013.01); *H01L 23/057* (2013.01); *H01L 23/13* (2013.01);
(Continued)

(58) Field of Classification Search
CPC .... H05K 1/183; H05K 1/0298; H05K 3/0097; H05K 2201/10121; H05K 2201/09072; H05K 1/11; H05K 1/111; H05K 1/114; H05K 1/117; H05K 1/18;H05K 1/181; H05K 3/18; H05K 3/181; H05K 3/244; H01L 23/057; H01L 23/13; H01L 27/14618; H01L 2924/0002; H01L 2924/00
See application file for complete search history.

(56) References Cited

U.S. PATENT DOCUMENTS 4,768,004 A * 8/1988 Wilson ...................... H01P 1/00
333/246
6,162,365 A * 12/2000 Bhatt ...................... H05K 3/062
205/125

(Continued)

FOREIGN PATENT DOCUMENTS

JP    S58-186953 A    11/1983
JP    2000-295036 A    10/2000
(Continued)

OTHER PUBLICATIONS

International Search Report dated May 31, 2011, issued for International Application No. PCT/JP2011/058034
(Continued)

*Primary Examiner* — Ishwarbhai B Patel
(74) *Attorney, Agent, or Firm* — Procopio Cory Hargreaves and Savitch LLP

(57) ABSTRACT

A many-up wiring substrate includes an insulating base substrate in which a plurality of wiring board regions are arranged in at least one of a vertical direction and a horizontal direction; a hole disposed in one main surface of the insulating base substrate, and straddling adjacent wiring board regions of the plurality of wiring board regions or straddling the wiring board regions and a dummy region; a conductor disposed on an inner surface of the hole; and a through hole disposed so as to extend from the inner surface of the hole of the wiring board regions to the other main surface of the insulating base substrate.

6 Claims, 16 Drawing Sheets

(51) Int. Cl.
  *H01L 23/13*   (2006.01)
  *H01L 23/057*  (2006.01)
  H05K 1/11      (2006.01)
  H05K 3/00      (2006.01)
  H01L 27/146    (2006.01)

(52) U.S. Cl.
  CPC ........ *H05K 1/183* (2013.01); *H01L 27/14618* (2013.01); *H01L 2924/0002* (2013.01); *H05K 1/11* (2013.01); *H05K 3/0097* (2013.01); *H05K 2201/09072* (2013.01); *H05K 2201/10121* (2013.01)

(56) References Cited

U.S. PATENT DOCUMENTS

| | | | |
|---|---|---|---|
| 6,418,030 B1* | 7/2002 | Yamaguchi | H01L 23/24 257/698 |
| 8,314,344 B2* | 11/2012 | Sakaguchi et al. | 174/260 |
| 2008/0012084 A1* | 1/2008 | Kwon et al. | 257/432 |
| 2008/0179711 A1* | 7/2008 | Fujimoto et al. | 257/620 |
| 2008/0318478 A1* | 12/2008 | Nelson | H05K 1/117 439/620.01 |

FOREIGN PATENT DOCUMENTS

| | | |
|---|---|---|
| JP | 2004-056061 A | 2/2004 |
| JP | 2007-201274 A | 8/2007 |

OTHER PUBLICATIONS

Office Action dated Mar. 5, 2014, issued in counterpart Korean application No. 10-2013-7004482.

\* cited by examiner

MANY-UP WIRING SUBSTRATE, WIRING BOARD, AND ELECTRONIC DEVICE

TECHNICAL FIELD

The present invention relates to a many-up wiring substrate in which a plurality of wiring board regions serving as wiring board for mounting electronic components are arranged in a central part of an insulating base substrate in at least one of a vertical direction and a horizontal direction.

BACKGROUND ART

In the related art, a wiring board for mounting a semiconductor element such as an imaging element or an electronic component such as a crystal oscillator has a configuration in which wiring conductors made of metalized powder of tungsten, molybdenum, or the like are arranged on a surface of an insulating substrate made of electrical insulating materials such as an aluminum oxide sintered body.

Such a wiring board has decreased in size with demands in recent years for decreasing the thickness and size of an electronic device. Thus, in order to efficiently manufacture a plurality of wiring board, the wiring board is manufactured by dividing a many-up wiring substrate. The many-up wiring substrate has a configuration in which a plurality of wiring board regions serving as wiring boards are formed on an insulating base substrate in a matrix form.

In such a wiring board, a castellation conductor is often formed for connection with an external circuit board. In the related art, the castellation conductor has been formed by forming a through hole in an insulating base substrate for a many-up wiring substrate, arranging wiring conductors on side surfaces of the through holes to form a plating coating on the wiring conductors, and dividing the many-up wiring substrate along an intended cutting line that passes through the through holes in a plan view. Moreover, in order to secure a wide region for mounting electronic components on the wiring board, the castellations are often formed by dividing holes which are open on a main surface side that faces the mounting surface of the wiring board but are not penetrated. However, openings of castellation holes decrease as the size of the wiring board decreases and the number of pins increases in recent years. In the forming of a plating coating on the surfaces of the wiring conductors on the side surfaces of the castellation holes, since the opening of the hole is small, when the wiring conductor is immersed in a plating solution, gas remains inside the hole so that it is difficult for the plating solution to enter into the hole. Moreover, there is another problem in that even when the plating solution enters into the hole, it is difficult for the plating solution outside to circulate inside the hole. Further, when the plating coating is deposited by an electrolytic plating method, hydrogen is generated by electrolysis to produce bubbles, and the bubbles stay inside the hole so that it is difficult for the plating solution to enter into the hole. Due to this, it is difficult to form the plating coating to a predetermined thickness on the surface of the wiring conductors on the side surfaces of the hole, which causes a problem in bonding with an external circuit board or the like. In regard to such a problem, a technique is disclosed in which a dummy region is provided around an individual wiring board region, a through hole that penetrates from the dummy region side is formed on a bottom part of a castellation hole, and a through hole in which an opening of one main surface of the wiring board positioned close to the external circuit board is smaller than an opening of the other main surface so that the plating solution can easily circulate (for example, see Patent Literature 1).

CITATION LIST

Patent Literature

Patent Literature 1: Japanese Unexamined Patent Publication JP-A 2007-201274

SUMMARY OF INVENTION

Technical Problem

However, with a further decrease in the size of a wiring board in recent years, even when a through hole is formed in a bottom part of a castellation hole, a plating solution does not sufficiently circulate inside the hole. In particular, the thickness of a plating coating deposited on the surface of the castellation conductor at a corner part formed between the bottom part and the side surface of the castellation hole is smaller than the thickness of the plating coating deposited on the surface of the castellation conductor near the opening of the hole. If such a corner part is positioned close to the wiring board region of the castellation hole, when the hole is divided to obtain a castellation notch, the plating coating does not have a sufficient thickness in a corner part of the notch. As described above, if a part that does not have a sufficient thickness is provided in the plating coating deposited on the surface of the castellation conductor, it is difficult to sufficiently bond a brazing material such as solder with the castellation conductor. Thus, the brazing material and the castellation conductor are separated and disconnected, and a problem in bonding with the wiring of the external circuit board occurs.

The invention has been made in view of the problem of the related art, and an object of the invention is to provide a many-up wiring substrate for manufacturing a small wiring board capable of satisfactorily realizing bonding with the wiring of the external circuit board.

Solution to Problem

A many-up wiring substrate according to the invention includes: an insulating base substrate having a plurality of wiring board regions arranged in at least one of a vertical direction and a horizontal direction; a hole disposed in one main surface of the insulating base substrate, and straddling adjacent wiring board regions of the plurality of wiring board regions or straddling the wiring board regions and a dummy region; a conductor disposed on an inner surface of the hole; and a through hole disposed so as to extend from the inner surface of the hole disposed in the wiring board regions to the other main surface of the insulating base substrate.

A wiring board according to the invention includes: an insulating substrate; a notch disposed on a side surface of the insulating substrate so as to extend from one main surface of the insulating substrate to halfway in a thickness direction of the insulating substrate; a conductor disposed on an inner surface of the notch; and a through hole disposed so as to extend from the inner surface of the notch to the other main surface or a side surface of the insulating substrate.

An electronic device according to the invention includes: the wiring board having the above-described configuration; an electronic component element mounted on the wiring board; and a lid disposed on the wiring board so as to cover the electronic component element.

Advantageous Effects of Invention

The many-up wiring substrate according to the invention includes: the insulating base substrate having a plurality of wiring board regions arranged in at least one of a vertical direction and a horizontal direction; a hole disposed in one main surface of the insulating base substrate, and straddling adjacent wiring board regions or straddling the wiring board regions and a dummy region; a conductor disposed on an inner surface of the hole; and a through hole disposed so as to extend from the inner surface of the hole to the other main surface of the insulating base substrate. Due to such a configuration, since a plating solution in a corner part formed between a side surface and a bottom surface of the hole can easily flow when the many-up wiring substrate is immersed in the plating solution, the plating solution is suppressed from remaining in the hole. Thus, since the plating solution can easily circulate in a part, where it is difficult for the plating solution to circulate, of the corner part formed between the side surface and the bottom surface of the hole so as to be close to the wiring board region, it is possible to deposit a plating coating to a desired thickness on the surface of the conductor that is disposed near the corner part formed between the side surface and the bottom surface of the hole. When such a hole is divided and used as a castellation conductor, it is possible to suppress the castellation conductor from being separated from an external circuit board.

A wiring board according to the invention includes: an insulating substrate; a notch disposed on a side surface of the insulating substrate so as to extend from one main surface of the insulating substrate to halfway in a thickness direction of the insulating substrate; a conductor disposed on an inner surface of the notch; and a through disposed so as to extend from the inner surface of the notch to the other main surface or a side surface of the insulating substrate. Due to such a configuration, the plating solution in the corner part formed between the side surface and the bottom surface of the notch can easily flow when the wiring board is immersed in the plating solution, and the plating solution is suppressed from remaining in the corner part of the notch. Thus, since the plating solution can easily circulate in a part, where it is difficult for the plating solution to circulate, of the corner part formed between the side surface and the bottom surface of the notch so as to be close to the center of the wiring board, it is possible to deposit a plating coating to a desired thickness on the surface of the conductor that is disposed near the corner part formed between the side surface and the bottom surface of the notch.

An electronic device according to the invention includes: the wiring board having the above-described configuration; an electronic component element mounted on the wiring board; and a lid disposed on the wiring board so as to cover the electronic component element. Due to such a configuration, since the plating coating having a desired thickness is deposited on the surface of the conductor, it is possible to increase the strength of the bonding between the electronic device and an external circuit board.

BRIEF DESCRIPTION OF DRAWINGS

6A is a plan view illustrating the example of the embodiment of the many-up wiring substrate shown in FIG. 4A.

DESCRIPTION OF EMBODIMENTS

Figure 1A:
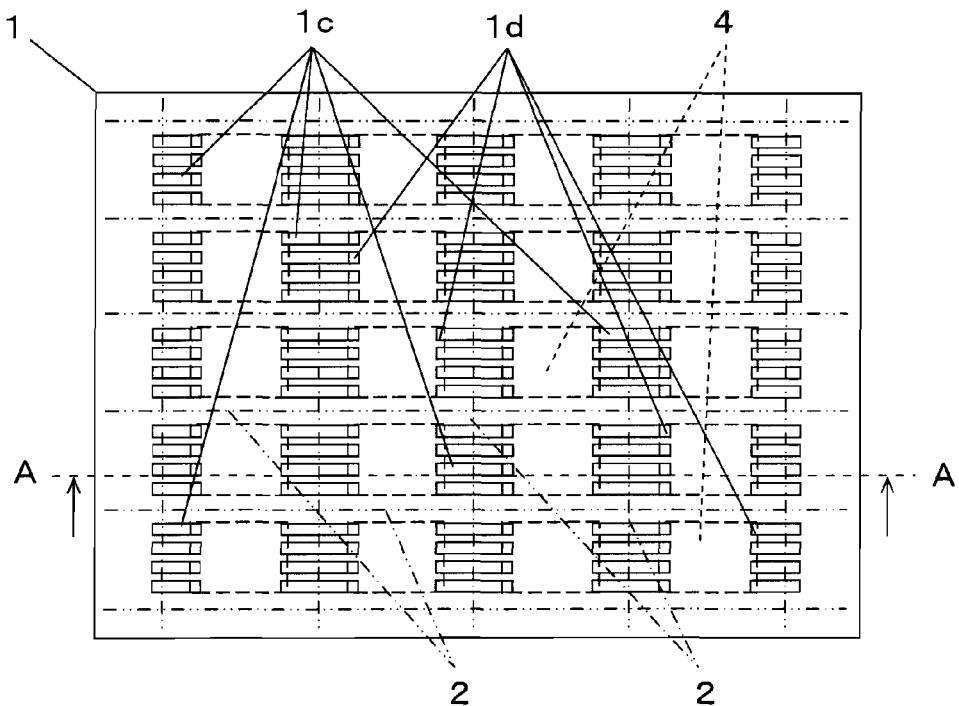
FIG. 1A is a plan view illustrating an example of an embodiment of a many-up wiring substrate according to the invention.

A many-up wiring substrate according to the invention will be described with reference to the accompanying drawings. In FIGS. 1A to 1C, 4A to 4C, 7A to 7C, and 10A to 10C, reference numeral 1 denotes an insulating base substrate, reference numeral 1a denotes a wiring board region, reference numeral 1b denotes a dummy region, reference numeral 1c denotes a hole, reference numeral 1d denotes a through hole, reference numeral 2 denotes an intended cutting line, reference numeral 3 denotes a conductor, reference numeral 4 denotes a recess part, reference numeral 5 denotes an insulating substrate, reference numeral 5a denotes a notch, reference numeral 6 denotes a lid, reference numeral 6a denotes a transparent part, reference numeral 6b denotes a side wall, reference numeral 7 denotes an electronic component element (imaging device), and reference numeral 8 denotes a bonding material.

As in the examples illustrated in FIGS. 1A to 1C, 4A to 4C, 7A to 7C, and 10A to 10C, a many-up wiring substrate according to the invention includes the insulating base substrate 1 having a plurality of wiring board regions 1a arranged in at least one of a vertical direction and a horizontal direction, the hole 1c disposed in one main surface of the insulating base substrate 1, and straddling adjacent wiring board regions 1a or straddling the wiring board regions 1a and the dummy region 1b, the conductor 3 disposed on an inner surface of the hole 1c, and the through hole 1d disposed so as to extend from the inner surface of the hole 1c to the other main surface of the insulating base substrate 1. Due to such a configuration, since a plating solution in a corner part formed between a side surface and a bottom surface of the hole 1c can easily flow when the many-up wiring substrate is immersed in the plating solution, the plating solution is suppressed from remaining in the hole 1c. Thus, since the plating solution can easily circulate in a part, where it is difficult for the plating solution to circulate, of the corner part formed between the side surface and the bottom surface of the hole 1c so as to be close to the wiring board region 1a, it is possible to deposit a plating coating to a desired thickness on the surface of the conductor 3 that is disposed near the corner part formed between the side surface and the bottom surface of the hole 1c. When such a hole is divided and used as a castellation conductor, it is possible to suppress the castellation conductor from being separated from an external circuit board.

The through hole 1d disposed so as to extend from the inner surface of the hole 1c to the other main surface of the insulating base substrate 1, corresponds to the structure of the through hole 1d that is disposed so as to extend from at least one of the side surface or the bottom surface of the hole 1c to the other main surface of the insulating base substrate 1.

Moreover, as in the examples illustrated in FIGS. 1A to 1C, 4A to 4C, 7A to 7C, and 10A to 10C, in the configuration of the many-up wiring substrate of the invention, when the opening of the through hole 1d is disposed in the inner surface of the hole 1c so as to be close to the center of each of the wiring board regions 1a, a plating solution in the corner part formed between the side surface and the bottom surface of the hole 1c so as to be close to the center of each of the wiring board regions 1a can easily flow when the many-up wiring substrate is immersed in the plating solution. Therefore, it is effective in forming the plating coating near the corner part formed between the side surface and the bottom surface of the hole 1c so as to be close to the center of each of the wiring board region 1a to a desired thickness.

In the above-described configuration, when the opening of the through hole 1d is disposed in the side surface of the hole 1c, it is preferable that the opening of the through hole 1d is disposed in the side surface of the hole 1c closer to the bottom surface since the plating solution in the corner part formed between the side surface and the bottom surface of the hole 1c can flow more easily.

Moreover, as in the examples illustrated in FIGS. 7A to 7C, and 10A to 10C, in the configuration of the many-up wiring substrate of the invention, the recess part 4 that overlaps a part of the hole 1c in a plan view is provided in the other main surface of the insulating base substrate 1, and an opening of the through hole 1d on a side of the other main surface is disposed in the bottom surface of the recess part 4. Thus, since the depth of the through hole 1d can be decreased, the plating solution can easily flow inside the through hole 1d. Therefore, it is possible to suppress the plating solution from remaining in the hole 1c more effectively and to deposit the plating coating uniformly on the surface of the conductor 3.

It is sufficient that a plurality of wiring board regions 1a are arranged in at least one of the vertical direction and the horizontal direction. In the examples illustrated in FIGS. 1A to 1C, 4A to 4C, 7A to 7C, and 10A to 10C, although five rows are arranged in the vertical direction and four rows of wiring board regions 1a are arranged in the horizontal direction, a larger number of rows of wiring board regions 1a may be arranged. For example, six rows of wiring board regions 1a may be arranged in the vertical direction, and nine rows of wiring board regions 1a may be arranged in the horizontal direction so that fifty four wiring board regions 1a may be arranged in total. Moreover, the many-up wiring substrate of the invention may be a many-up wiring substrate in which one row of wiring board regions 1a is arranged in the vertical direction and four rows of wiring board regions 1a are arranged in the horizontal direction so that four wiring board regions 1a are arranged in total. Further, the many-up wiring substrate of the invention may be a many-up wiring substrate in which three rows of wiring board regions 1a are arranged in the vertical direction and one row of wiring board regions 1a is arranged in the horizontal direction so that three wiring board regions 1a are arranged in total. The arrangement of the wiring board regions 1a is set according to the size of the insulating base substrate 1 and the wiring board region 1a, the arrangement of the electronic components and the conductors 3 mounted on the wiring board region 1a, and the like. In the example illustrated in FIGS. 10A to 10C4, a third through hole 1e is formed in the bottom surface of the recess part 4.

The insulating base substrate 1 is made of insulating materials such as ceramics or resin. When ceramics are used, examples thereof include an aluminum oxide sintered body (alumina ceramics), an aluminum nitride sintered body, a mullite sintered body, and a glass ceramics sintered body. When resin is used, examples thereof include an epoxy resin, a polyimide resin, an acrylic resin, a phenol resin, a polyester resin, and a fluoric resin including a tetrafluoroethylene resin. Moreover, like a glass epoxy resin, a material that is impregnated into a base material made of glass fiber may also be used.

When the insulating base substrate 1 is made of an aluminum oxide sintered body, for example, the insulating base substrate 1 is produced as follows. An appropriate organic solvent and an appropriate dissolvent are added to and mixed with raw material powder such as alumina ($Al_2O_3$), silica ($SiO_2$), calcium oxide (CaO), and magnesia (MgO) to obtain a slurry, the slurry is processed into a sheet form using a known doctor blade method, a calendar roll method, or the like to obtain a ceramic green sheet, the ceramic green sheet is then subjected to appropriate punching processing, and if necessary, a plurality of sheets are stacked and the resultant is fired at high temperature (approximately 1500 to 1800° C.) to obtain the insulating base substrate 1.

When the insulating base substrate 1 is made of resin, for example, the insulating base substrate 1 can be molded by transfer molding, injection molding, or the like using a mold capable of molding the insulating base substrate into a predetermined shape of the many-up wiring substrate. Moreover, like a glass epoxy resin, a material that is impregnated into a base material made of glass fiber may also be used. In this case, the insulating base substrate 1 can be formed by impregnating a precursor epoxy resin into a base material made of glass fiber and thermally curing the precursor epoxy resin at a predetermined temperature.

As in the examples illustrated in FIGS. 1A to 1C, 4A to 4C, 7A to 7C, and 10A to 10C, the hole 1c is disposed so as to extend straddling adjacent wiring board regions 1a or straddling the wiring board regions 1a and the dummy region 1b and is provided to be open in one main surface of the insulating base substrate 1. Such a hole 1c serves as the castellation notch 5a when the many-up wiring substrate is divided to obtain the wiring board. Such a hole 1c is a bottomed hole that extends halfway in the thickness direction of the insulating base substrate 1, and is formed in a polygonal shape such as a rectangle or a hexagon or a circular shape such as a circle or an ellipse in a plan view.

When the insulating base substrate 1 is made of ceramics, the insulating base substrate 1 having the hole 1c can be produced by stacking a first ceramic green sheet in which a first through hole for the hole 1c is disposed at a desired position by punching and performing laser processing using a mold on a second ceramic green sheet and then firing them. Moreover, the insulating base substrate 1 having the hole 1c may also be produced by subjecting a ceramic green sheet or a ceramic sintered body obtained by firing a ceramic green sheet to mechanical processing such as drilling or laser processing with lower power than that when forming the through hole. When the insulating base substrate 1 is made of resin, the insulating base substrate 1 having the hole 1c may be produced using an appropriate mold or may be produced by performing mechanical processing such as drilling or laser processing after forming the insulating base substrate 1.

As in the examples illustrated in FIGS. 1A to 1C, 4A to 4C, 7A to 7C, and 10A to 10C, it is preferable that the through hole 1d is disposed so as to extend from a corner part formed between the side surface and the bottom surface of the hole 1c so as to be close to the center of each of the wiring board region 1a to the other main surface of the insulating base substrate 1. In this case, it is effective in making the plating solution in the corner part formed between the side surface and the bottom surface of the hole 1c closer to the center of each of the wiring board regions 1a flow easily when the insulating base substrate 1 is immersed in the plating solution.

As in the examples illustrated in FIGS. 4A to 4C, 7A to 7C, and 10A to 10C, when the through hole 1d is formed linearly in the thickness direction of the insulating base substrate 1, since the through hole 1d has a linear form, it is effective in making the plating solution pass easily through the through hole 1d and making it difficult for the plating solution to remain in the hole 1c when the insulating base substrate 1 is immersed in the plating solution as compared to when the through hole 1d is bent.

Moreover, as in the examples illustrated in FIGS. 1A to 1C, 4A to 4C, 7A to 7C, and 10A to 10C, when the opening of the through hole 1d is formed on the inner surface of the hole 1c so as to be along the corner formed between the side surface and the bottom surface of the hole 1c, since the plating solution can easily flow in the corner part formed between the side surface and the bottom surface, it is effectively to make it difficult for the plating solution to remain in the hole 1c.

As in the examples illustrated in FIGS. 1A to 1C, 4A to 4C, and 10A to 10C, when such a through hole 1d is disposed so as to face two corner parts on the left and right sides of the rectangular hole 1c, the plating solution flows into the left and right through holes 1d. Thus, it is possible to suppress the plating solution from remaining in the corner part of the hole 1c more effectively.

In particular, when the through hole 1d is disposed on both end parts in the longitudinal direction of the long sides of the rectangular hole 1c, the plating solution also flows toward the through hole 1d, and it is effective in forming the plating coating also in a corner part where the through hole 1d is not disposed. Moreover, the through hole 1d is disposed over the entire end part of the rectangular hole 1c in a plan view. Further, as in the examples illustrated in FIGS. 4A to 4C, 7A to 7C, and 10A to 10C, when the through hole 1d is disposed on the bottom part of the hole 1c, the through hole 1d is disposed over the entire end part of the bottom part of the hole 1c in a plan view.

Moreover, when the through hole 1d is formed in the rectangular hole 1c, and the through hole 1d is formed in a C-shape that extends along the three sides of the bottom surface, it is effective in decreasing the corner part where the plating solution is likely to remain and increasing the range in which the plating coating is formed to have a desired thickness.

Figure 7A:
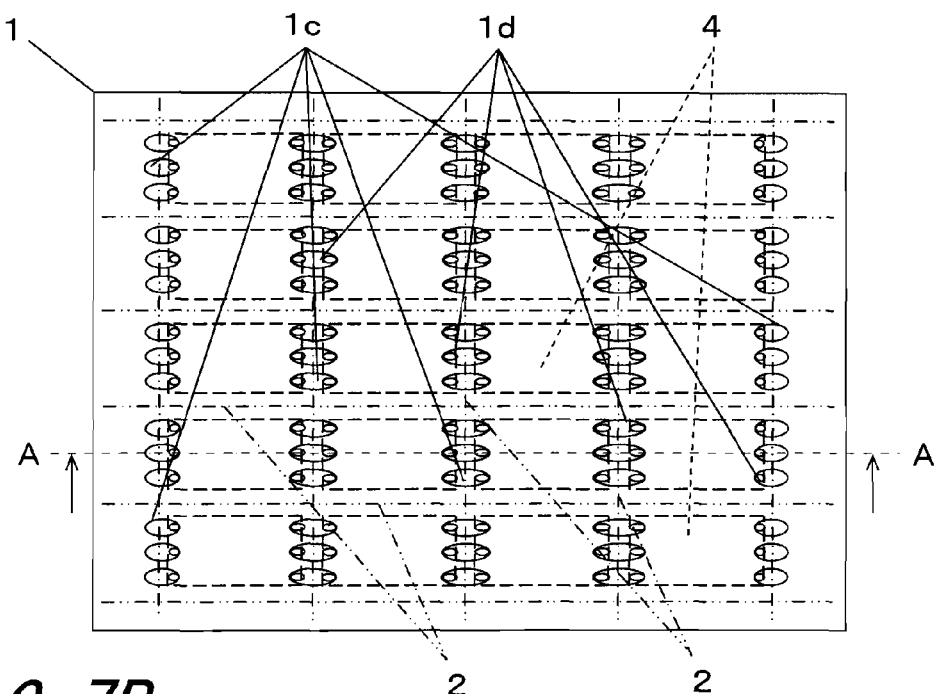
FIG. 7A is a plan view illustrating another example of an embodiment of a many-up wiring substrate according to the invention.
Figure 7B:
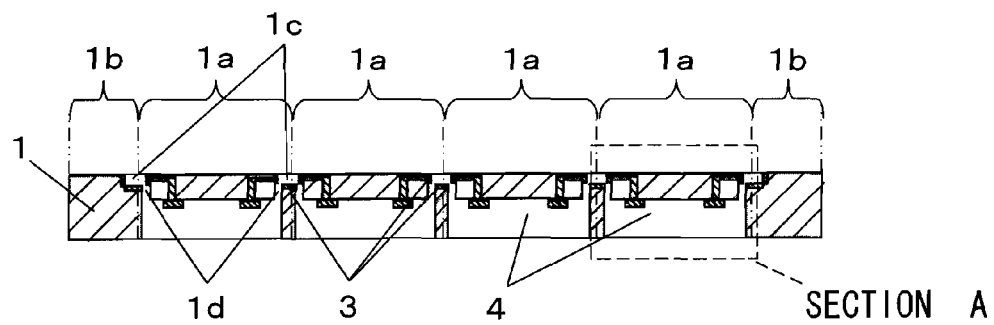
FIG. 7B is a cross-sectional view taken along the line A-A of FIG. 7A.
Figure 7C:
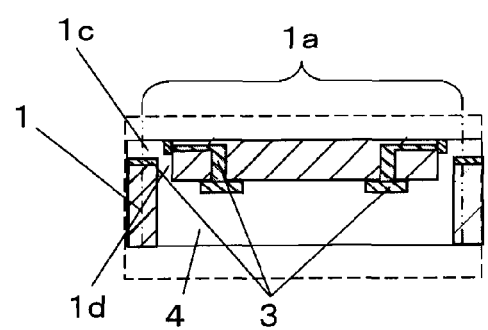
FIG. 7C is an enlarged cross-sectional view of a main part in the section A in FIG. 7B.
Figure 8A:
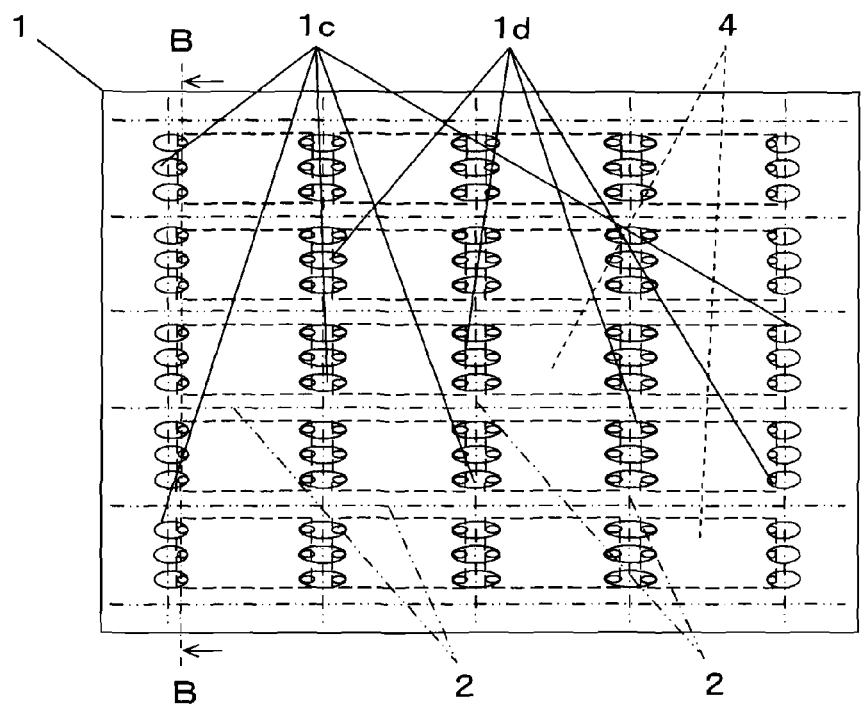
FIG. 8A is a plan view illustrating the example of the embodiment of the many-up wiring substrate shown in FIG. 7A.
Figure 8B:
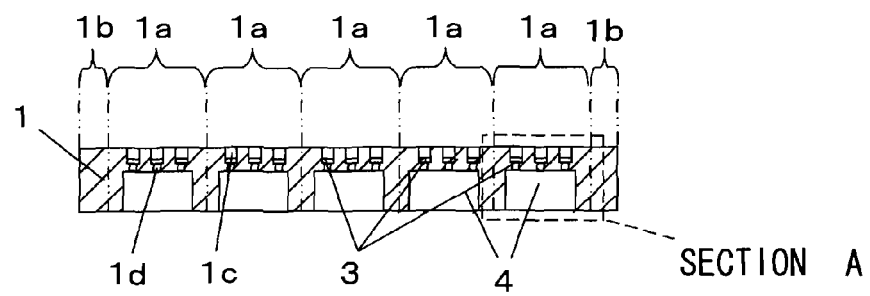
FIG. 8B is a cross-sectional view taken along the line B-B of FIG. 8A.
Figure 8C:
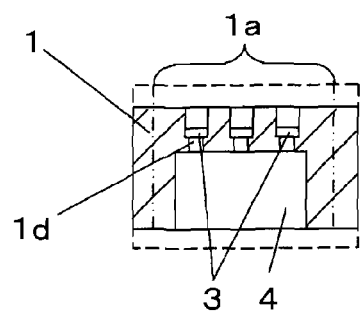
FIG. 8C is an enlarged cross-sectional view of a main part in the section A in FIG. 8B.
Figure 9A:
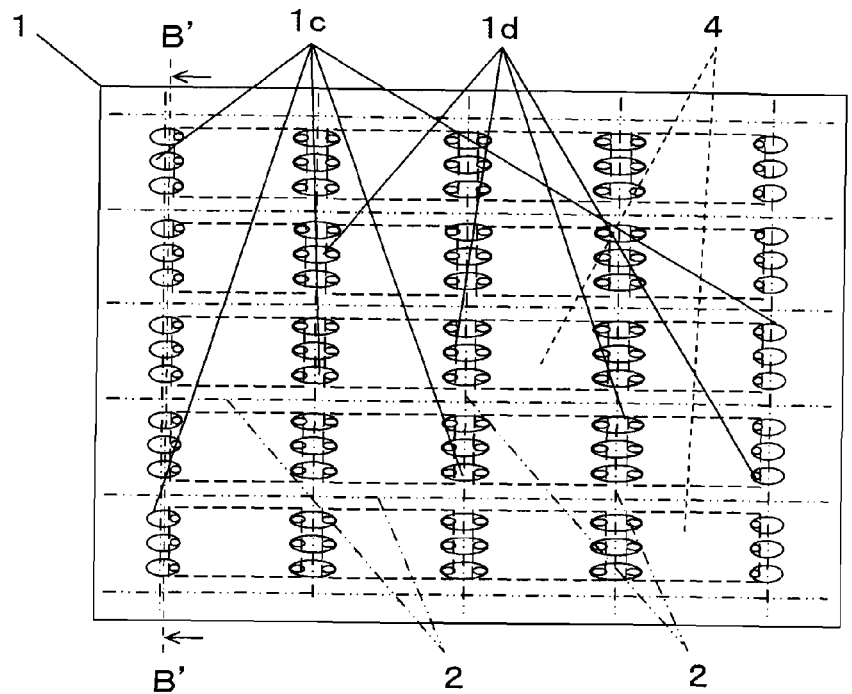
FIG. 9A is a plan view illustrating the example of the embodiment of the many-up wiring substrate shown in FIG. 7A.
Figure 9B:
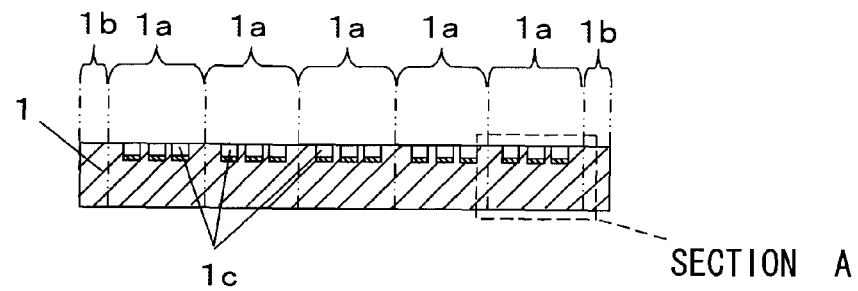
FIG. 9B is a cross-sectional view taken along the line B'-B' of FIG. 9A.
Figure 9C:
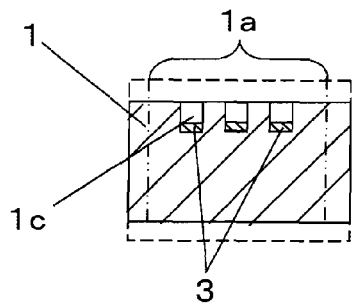
FIG. 9C is an enlarged cross-sectional view of a main part in the section A in FIG. 9B.
Figure 10A:
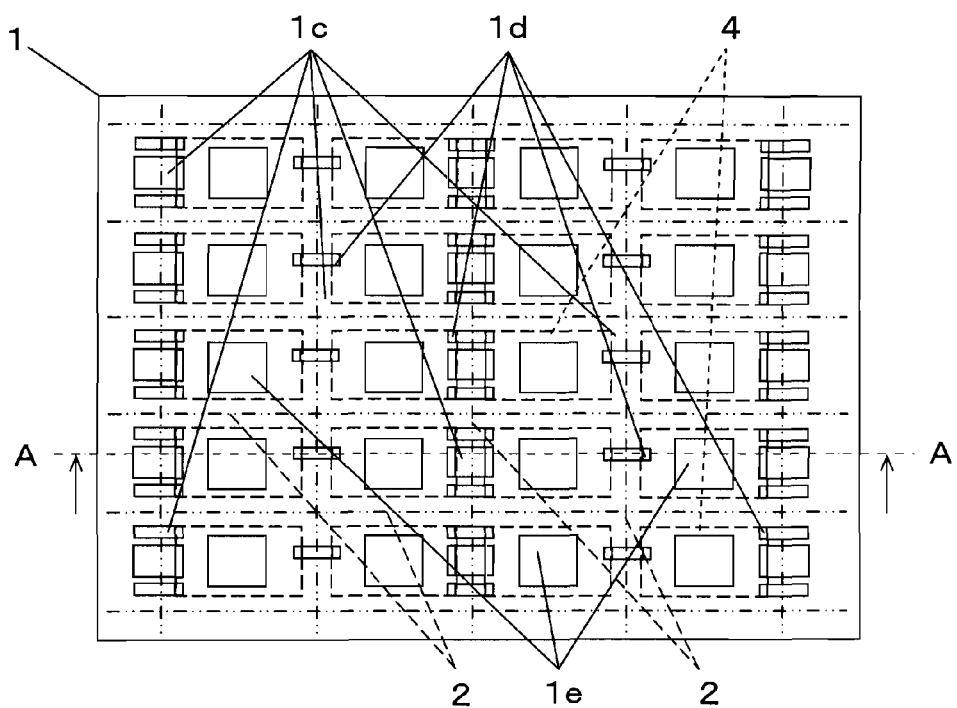
FIG. 10A is a plan view illustrating another example of an embodiment of a many-up wiring substrate according to the invention.
Figure 10B:
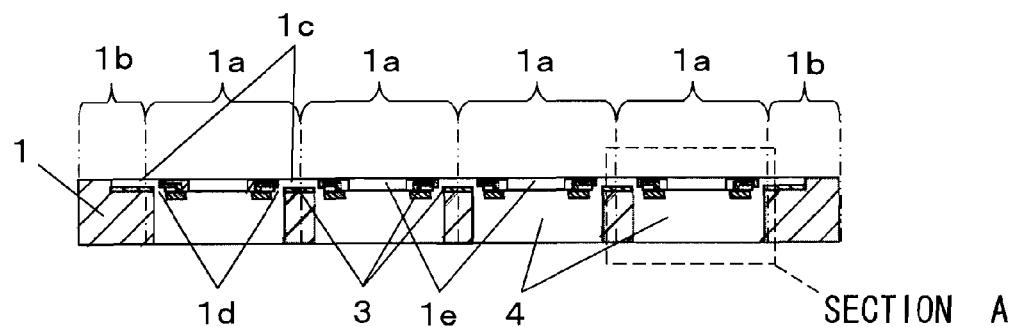
FIG. 10B is a cross-sectional view taken along the line A-A of FIG. 10A.
Figure 10C:
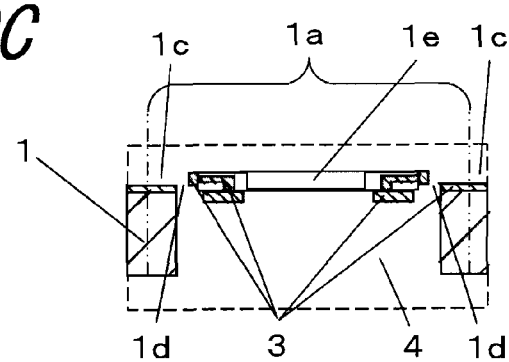
FIG. 10C is an enlarged cross-sectional view of a main part in the section A in FIG. 10B.
Figure 11A:
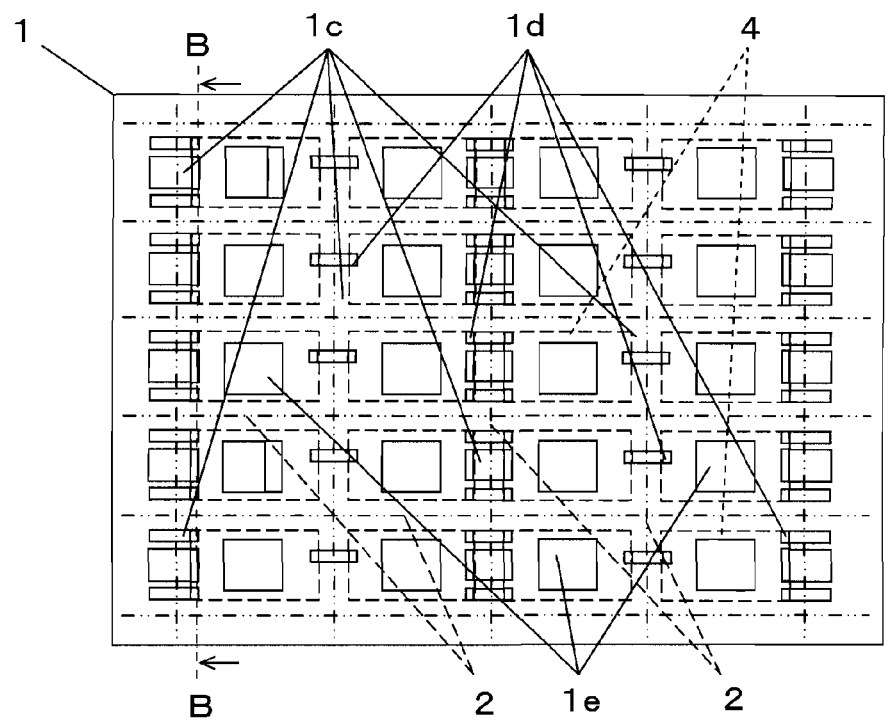
FIG. 11A is a plan view illustrating the example of the embodiment of the many-up wiring substrate shown in FIG. 10A.
Figure 11B:
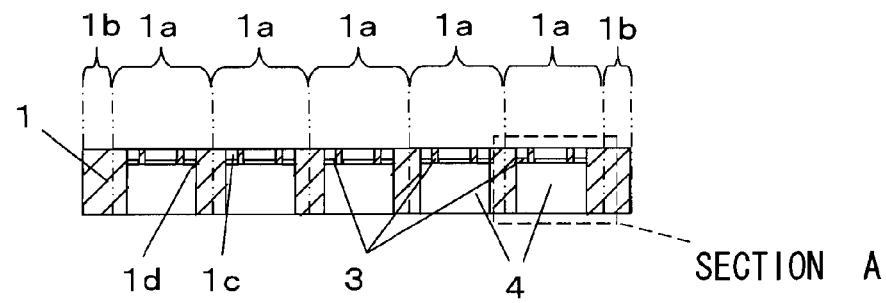
FIG. 11B is a cross-sectional view taken along the line B-B of FIG. 11A.
Figure 11C:
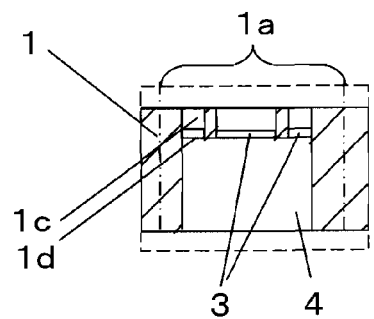
FIG. 11C is an enlarged cross-sectional view of a main part in the section A in FIG. 11B.
Figure 12A:
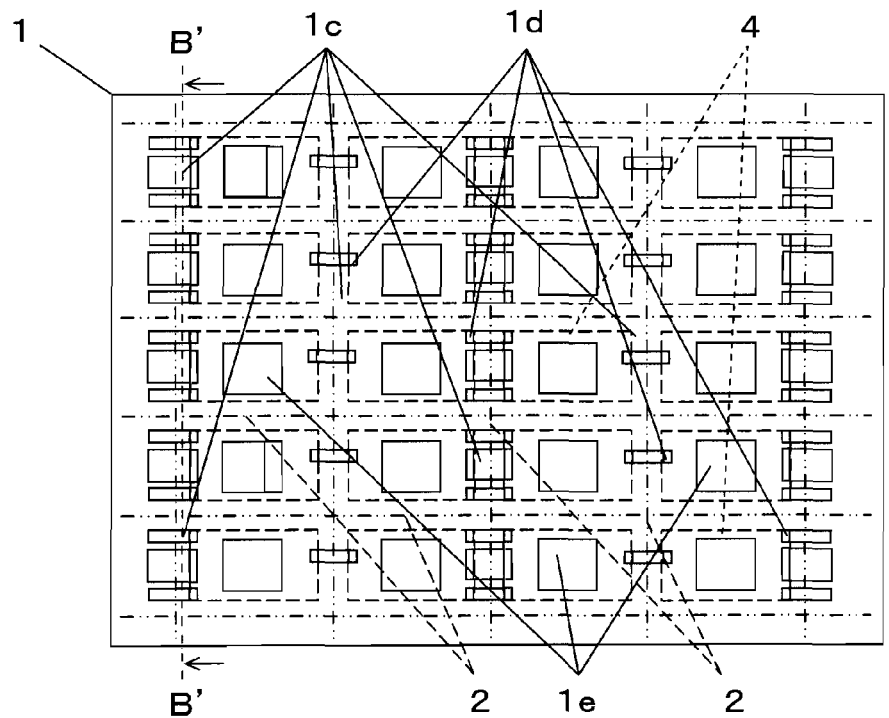
FIG. 12A is a plan view illustrating the example of the embodiment of the many-up wiring substrate shown in FIG. 10A.
Figure 12B:
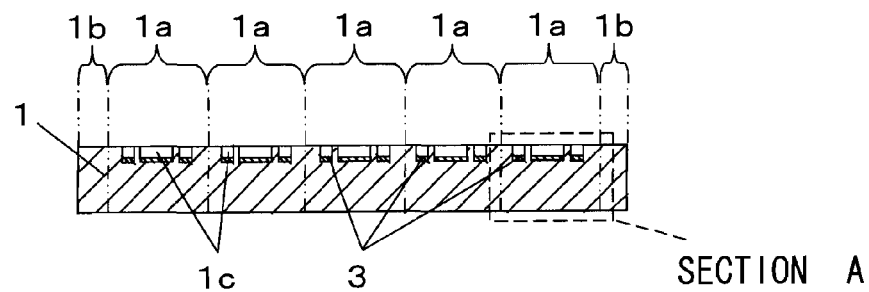
FIG. 12B is a cross-sectional view taken along the line B'-B' of FIG. 12A.
Figure 12C:
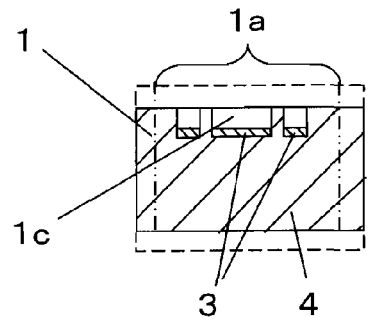
FIG. 12C is an enlarged cross-sectional view of a main part in the section A in FIG. 12B.
Figure 13A:
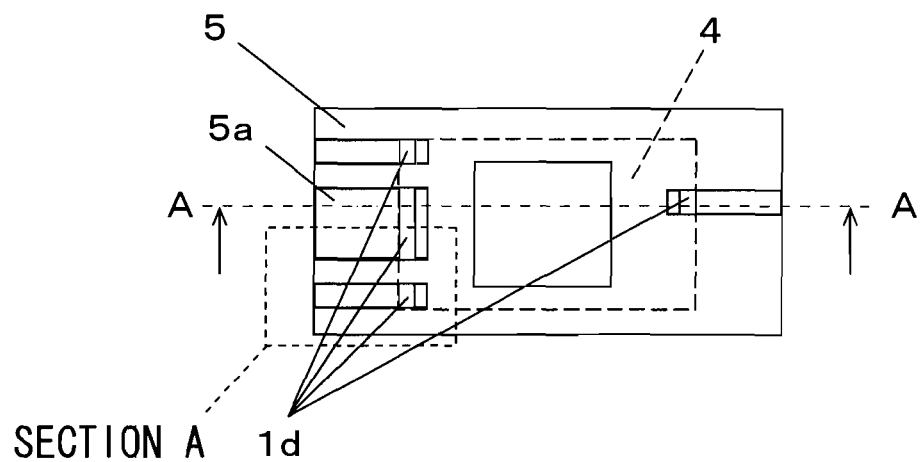
FIG. 13A is a plan view illustrating an example of an embodiment of a wiring board according to the invention.
Figure 13B:
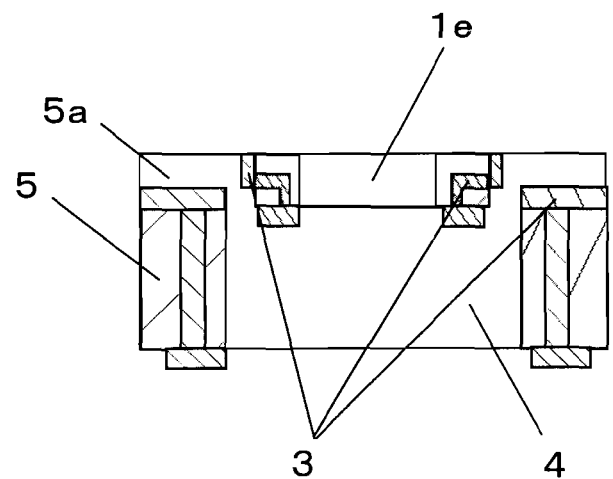
FIG. 13B is a cross-sectional view taken along the line A-A of FIG. 13A.
Figure 14A:
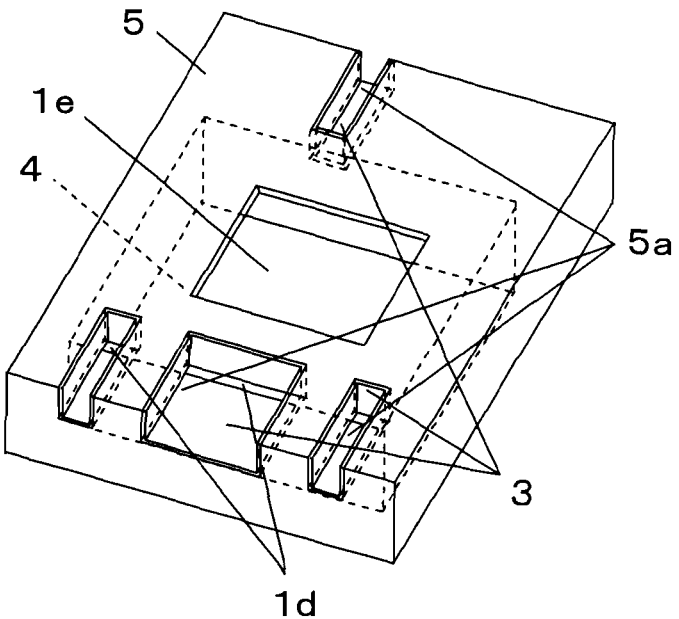
FIG. 14A is a perspective view illustrating an example of an embodiment of a wiring board according to the invention.
Figure 14B:
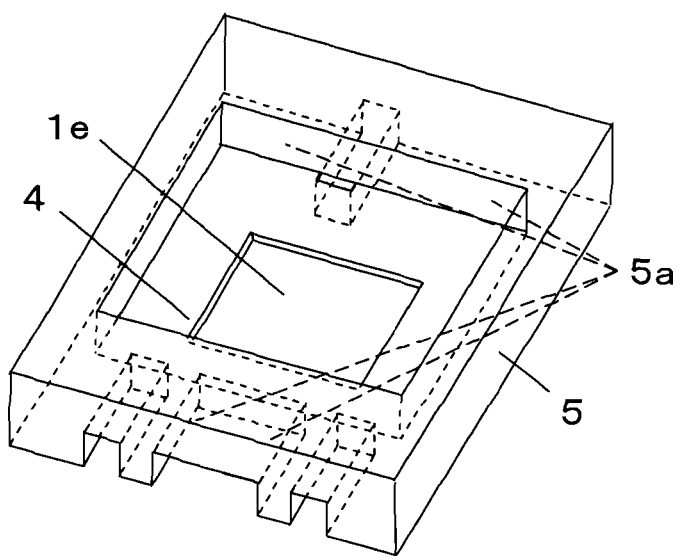
FIG. 14B is a perspective view of a lower surface illustrated in FIG. 14A.
Figure 15A:
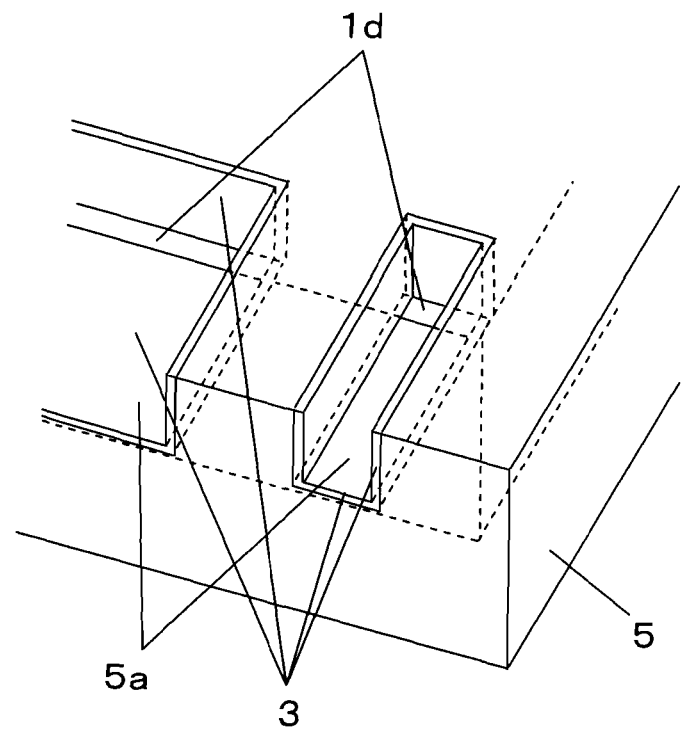
FIG. 15A is an enlarged perspective view of a main part of the section A in FIG. 13A.
Figure 15B:
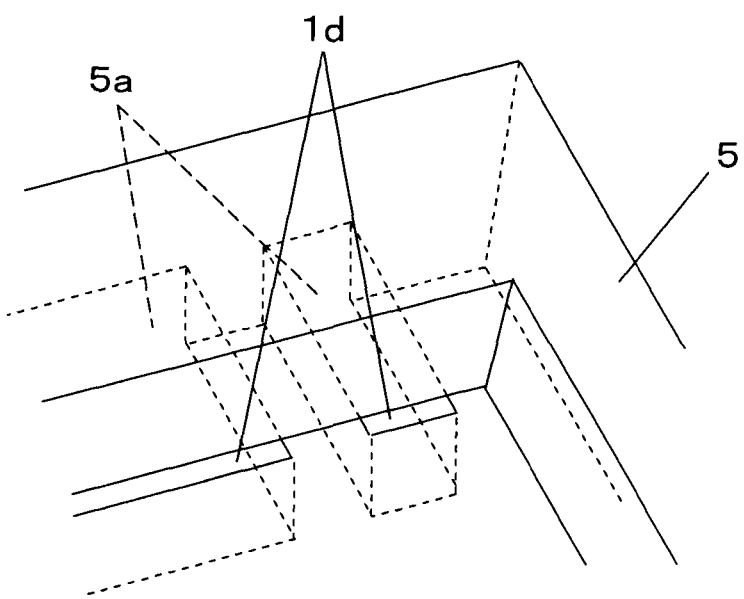
FIG. 15B is a perspective view of a lower surface illustrated in FIG. 15A.

Moreover, as in the example illustrated in FIGS. 7A to 7C, when the hole 1c and the through hole 1d are formed in a circular form in plan view, the hole 1c does not have a corner part in a plan view, and it is effective in making it difficult for the plating solution to remain in the corner part when the plating solution flows from the through hole 1d.

The through hole 1d described above can be formed by the same method as that when forming the hole 1c. That is, when the insulating base substrate 1 is made of ceramics, the insulating base substrate 1 having the through hole 1d can be produced by stacking a second ceramic green sheet in which a second through hole for the through hole 1d smaller than the first through hole for the hole 1c is disposed on the first ceramic green sheet having the first through hole so that the second through hole is positioned in the first through hole in a plan view and then firing them. Moreover, the through hole 1d may be formed by subjecting the insulating base substrate 1 having the hole 1c to mechanical processing or laser processing. When it is difficult for the through hole 1d to have predetermined dimensions due to misalignment of a plurality of ceramic green sheets, it is preferable to form the through hole 1*d* after forming the hole 1*c*.

As in the examples illustrated in FIGS. 1A to 1C, 7A to 7C, and 10A to 10C, the recess part 4 may be disposed in a main surface of the insulating base substrate 1 opposite the main surface where the hole 1*c* is disposed. When the recess part 4 is disposed so as to overlap the hole 1*c* in a plan view, it is preferable that the through hole 1*d* is disposed between the corner part formed between the side surface and the bottom surface of the hole 1*c*, and the bottom surface of the recess part 4. Since the length of the through hole 1*d* can be decreased, it is further effective in making the plating solution pass easily through the through hole 1*d* and making the plating solution difficult to remain in the hole 1*c*.

Moreover, when the recess part 4 is disposed so as to overlap the hole 1*c* in a plan view, it is preferable that the through hole 1*d* is open in the bottom surface of the hole 1*c* closer to the center of each of the wiring board region 1*a*. Due to such a configuration, it is effective in forming the penetration hole 1*d* of the through hole 1*d* in a linear form so as to be open in the bottom surface or the side surface of the recess part 4.

Figure 4A:
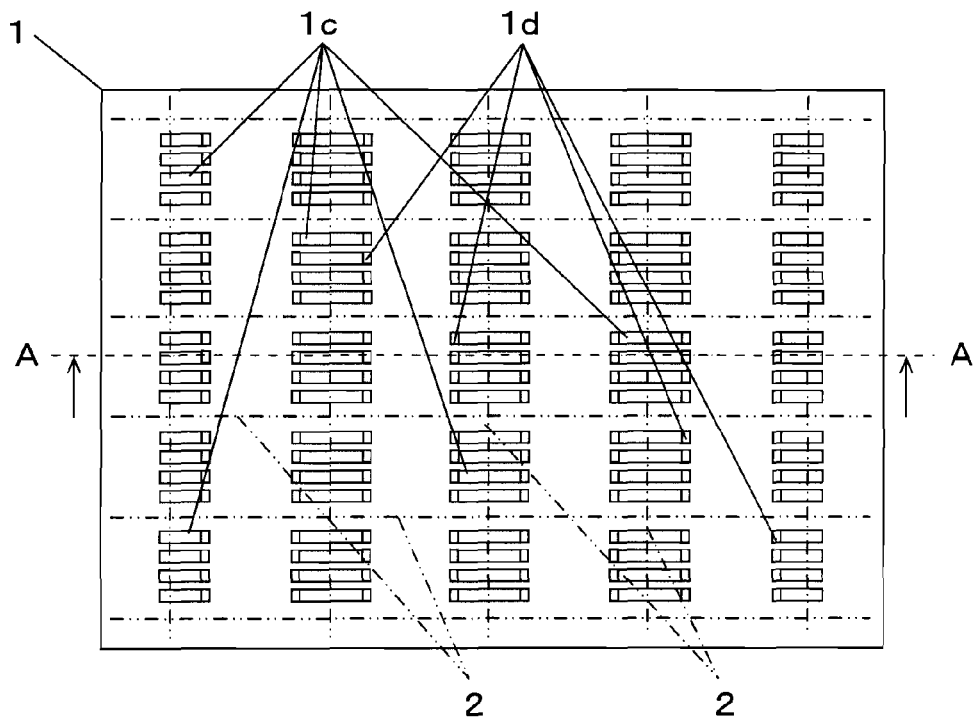
FIG. 4A is a plan view illustrating another example of an embodiment of a many-up wiring substrate according to the invention.
Figure 4B:
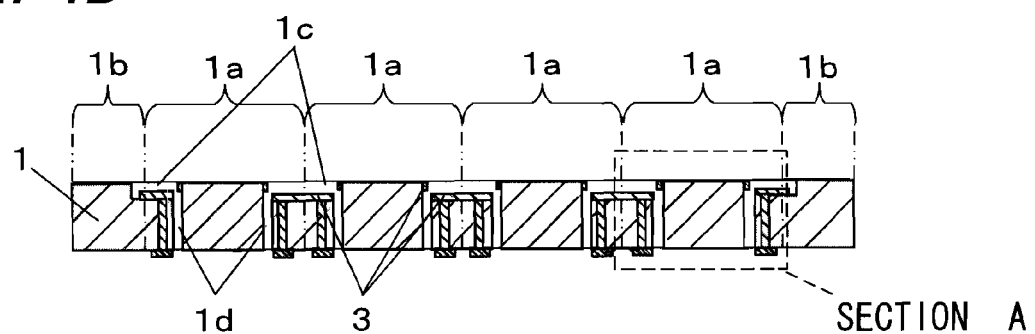
FIG. 4B is a cross-sectional view taken along the line A-A of FIG. 4A.
Figure 4C:
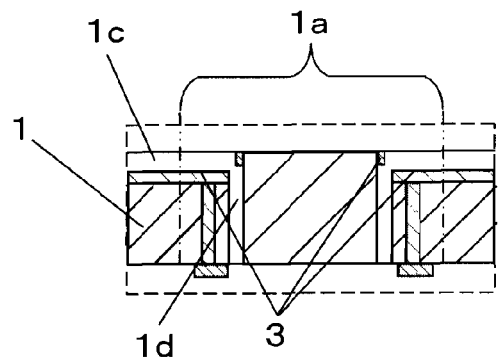
FIG. 4C is an enlarged cross-sectional view of a main part in the section A in FIG. 4B.
Figure 5A:
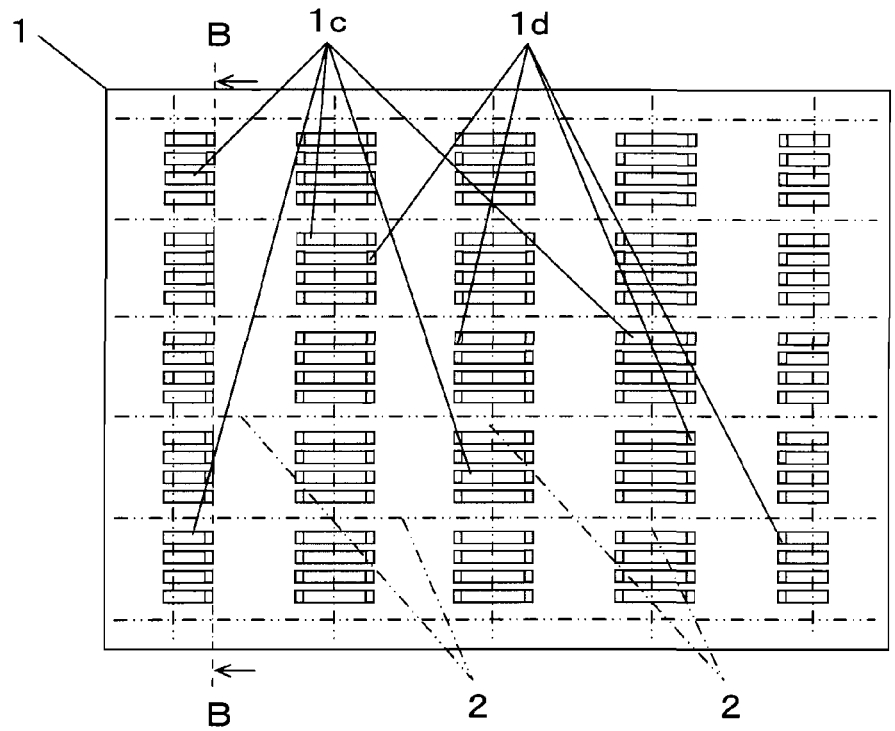
FIG. 5A is a plan view illustrating the example of the embodiment of the many-up wiring substrate shown in FIG. 4A.
Figure 5B:
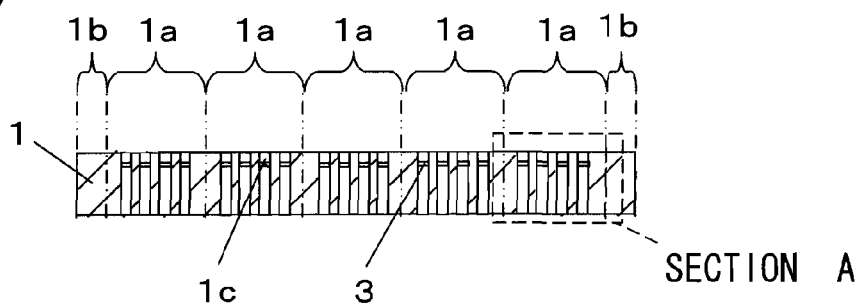
FIG. 5B is a cross-sectional view taken along the line B-B of FIG. 5A.
Figure 5C:
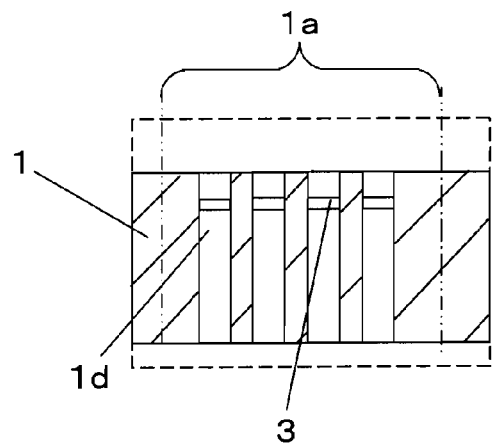
FIG. 5C is an enlarged cross-sectional view of a main part in the section A in FIG. 5B.
Figure 6A:
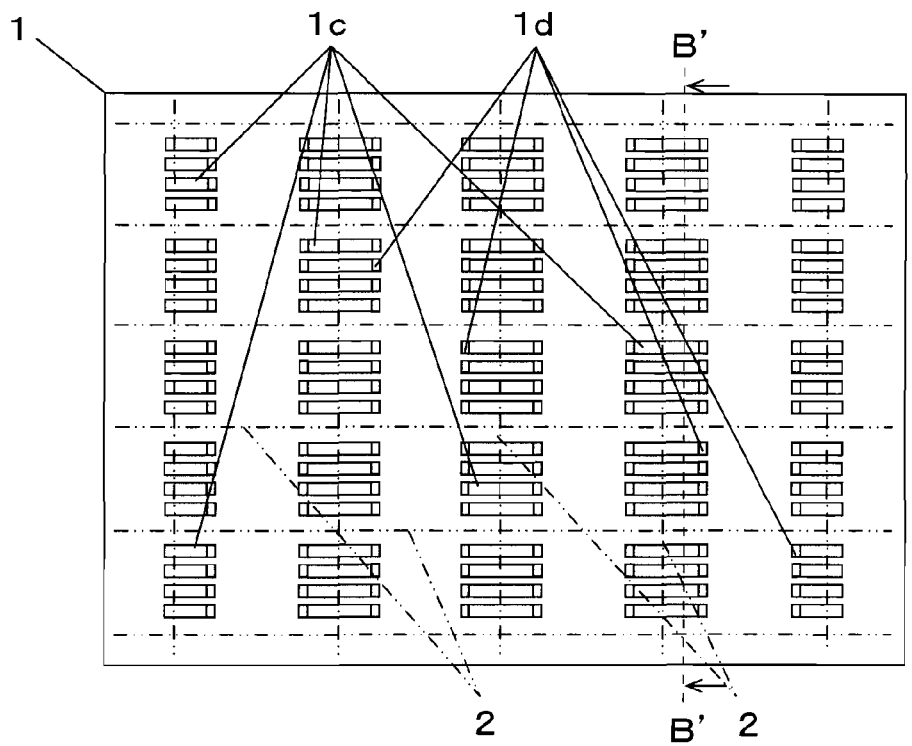
FIG. 6B is a cross-sectional view taken along the line B'-B' of FIG. 6A.
FIG. 6C is an enlarged cross-sectional view of a main part in the section A in FIG. 6B.
Figure 6B:
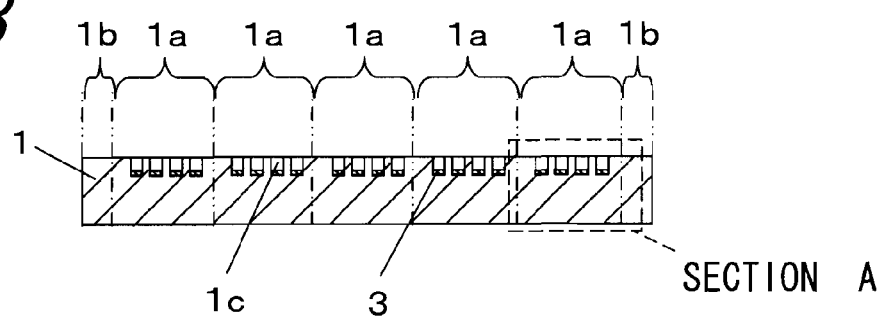
Figure 6C:
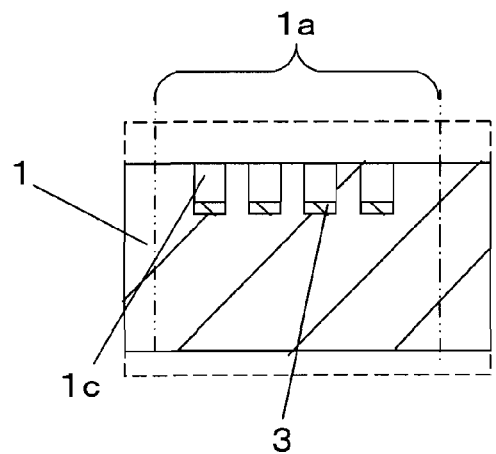

As in the example illustrated in FIGS. 4A to 4C, when the through hole 1*d* is bent, even if a bonding material such as resin for fixing an electronic component flows into the through hole 1*d* when the electronic component is mounted in the recess part 4, since the bonding material is likely to remain in the through hole 1*d*, it is possible to suppress the bonding material from flowing up to the hole 1*c*.

As in the example of FIGS. 7A to 7C, the hole 1*c* and the recess part 4 are disposed so as to overlap each other in a plan view. In such a case, it is preferable that the through hole 1*d* has a linear form between the corner part of the hole 1*c* and the bottom surface of the recess part 4 so as to penetrate the overlapping part of the hole 1*c* and the recess part 4 in a plan view. Since the through hole 1*d* has a linear form, it is effective in suppressing the plating solution from remaining in the hole 1*c*. Further, as in the example illustrated in FIGS. 10A to 10C, when the bottom part of the hole 1*c* and the bottom part of the recess part 4 are at the same height in a cross-sectional view, or when the hole 1*c* and the recess part 4 overlap each other in a cross-sectional view, it is particularly preferable since the length in the thickness direction of the through hole 1*d* can be decreased.

Figure 1B:
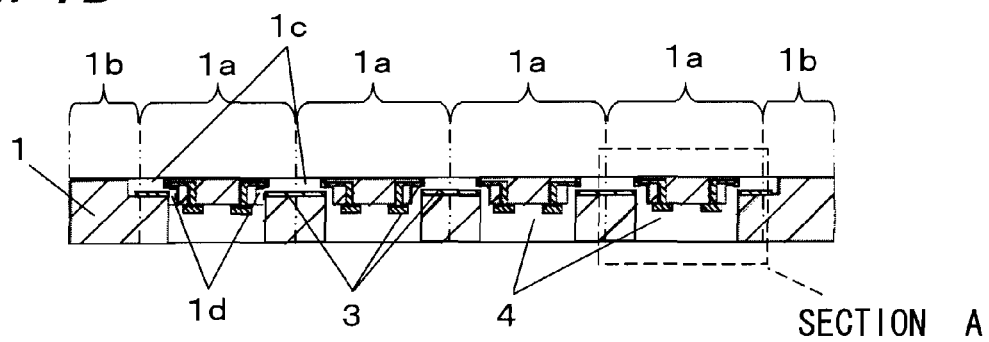
FIG. 1B is a cross-sectional view taken along the line A-A of FIG. 1A.
Figure 1C:
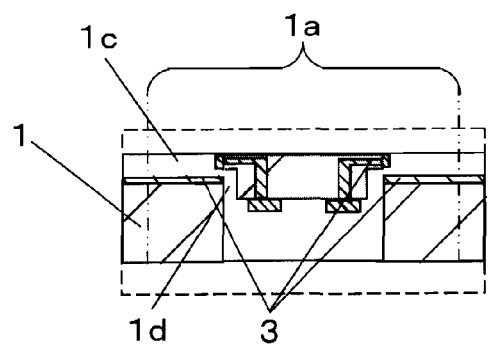
FIG. 1C is an enlarged cross-sectional view of a main part in the section A in FIG. 1B.
Figure 2A:
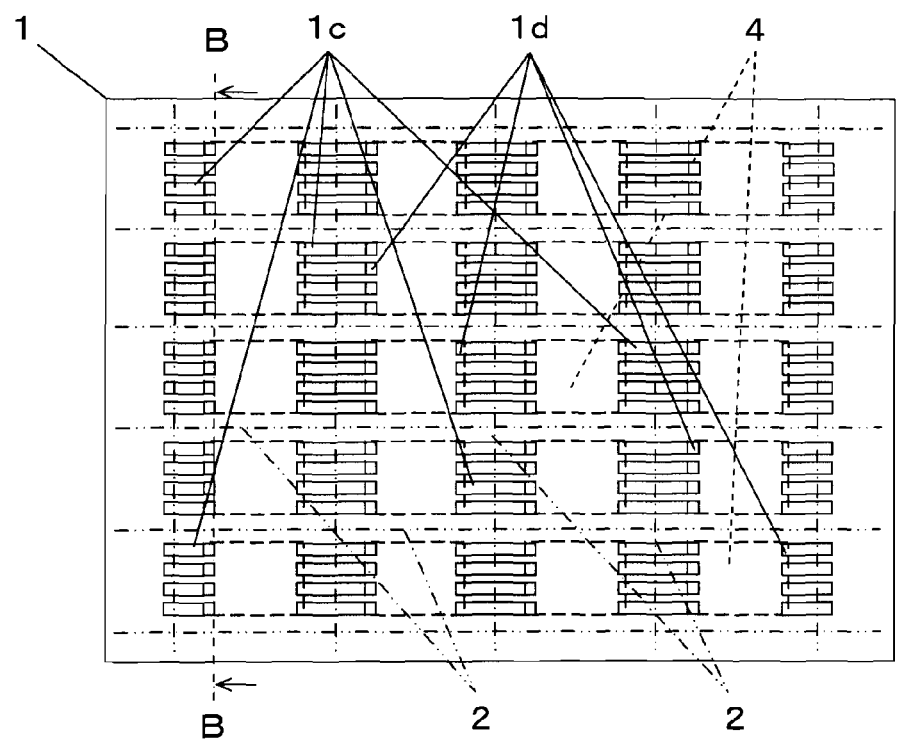
FIG. 2A is a plan view illustrating the example of the embodiment of the many-up wiring substrate shown in FIG. 1A.
Figure 2B:
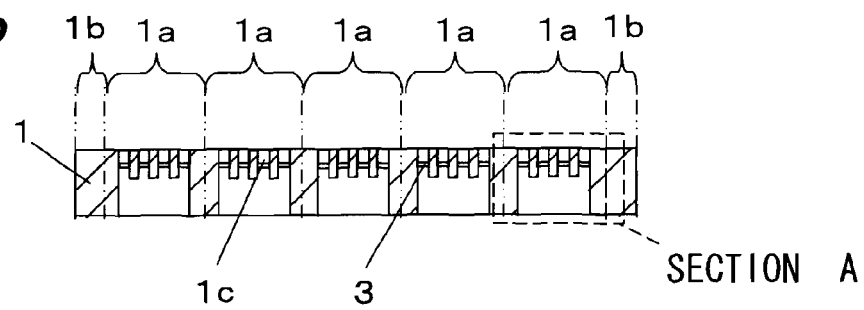
FIG. 2B is a cross-sectional view taken along the line B-B of FIG. 2A.
Figure 2C:
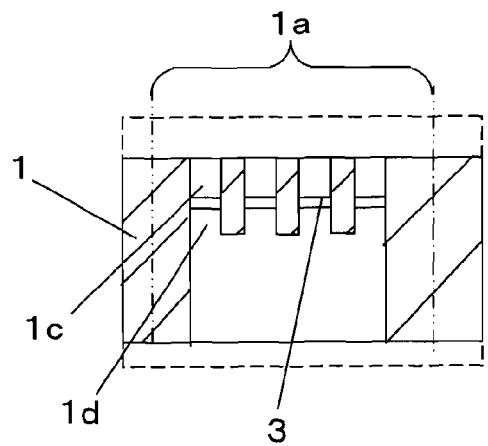
FIG. 2C is an enlarged cross-sectional view of a main part in the section A in FIG. 2B.
Figure 3A:
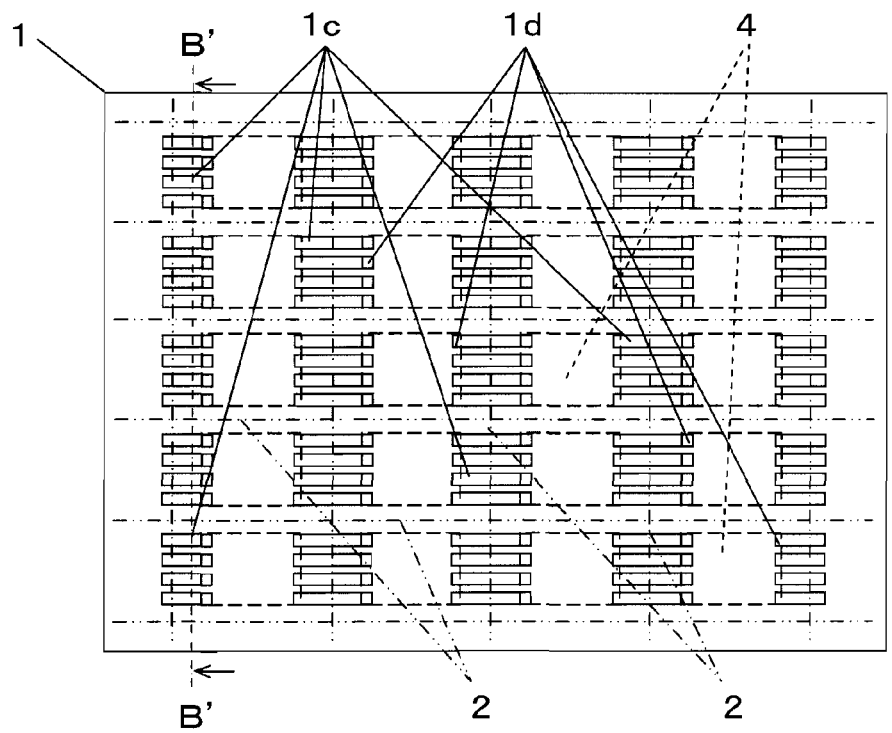
FIG. 3A is a plan view illustrating the example of the embodiment of the many-up wiring substrate shown in FIG. 1A.
Figure 3B:
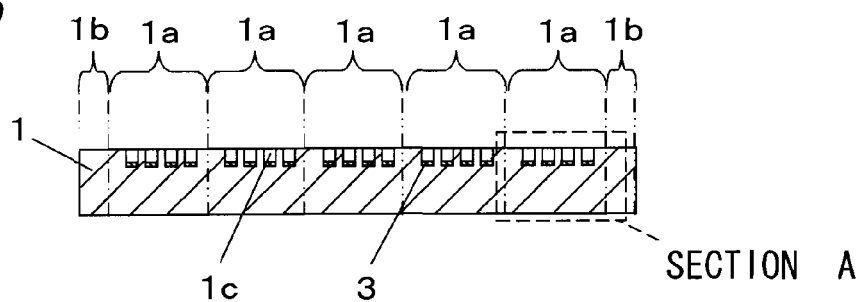
FIG. 3B is a cross-sectional view taken along the line B'-B' of FIG. 3A.
Figure 3C:
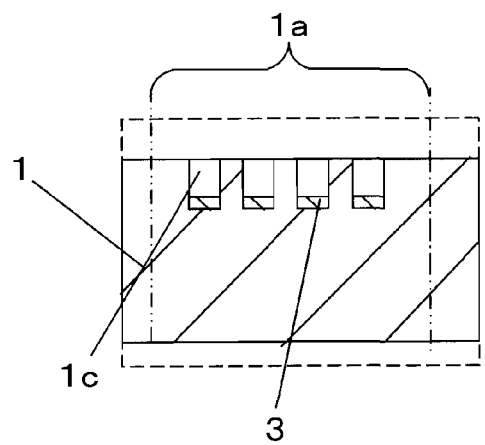
FIG. 3C is an enlarged cross-sectional view of a main part in the section A in FIG. 3B.

Moreover, as in the example illustrated in FIGS. 1A to 1C, when the opening of the through hole 1*d* is disposed in the side surface of the hole 1*c* of each of the wiring board region 1*a* so as to be in contact with the bottom surface of the hole 1*c*, since it is not necessary to form a bent part unlike in a case where the opening of the through hole 1*d* is disposed in the side surface of the hole 1*c* so as to be close to one main surface of the insulating base substrate 1, it is effective in forming the through hole 1*d* in a linear form.

When the insulating base substrate 1 is made of ceramics, the conductor 3 is made of metalized powder of tungsten (W), molybdenum (Mo), manganese (Mn), silver (Ag), copper (Cu), or the like and is formed at a predetermined position of the insulating base substrate 1 by printing a metalized paste for the conductor 3 on a ceramic green sheet for the insulating base substrate 1 in a predetermined shape by screen printing or the like and co-firing the metalized paste together with the ceramic green sheet for the insulating base substrate 1.

The conductor 3 includes a wiring conductor that is disposed on the surface of the insulating base substrate 1 and between insulating layers and a penetrating conductor that penetrates through the insulating layers and electrically connects upper and lower conductors 3. When the insulating base substrate 1 is made of ceramics, the wiring conductor disposed on the surface or between insulating layers is formed by printing and applying the metalized paste for the conductor 3 on the ceramic green sheet for the insulating base substrate 1 using printing means such as screen printing and firing the metalized paste together with a molded body for the insulating base substrate 1. Moreover, the penetrating conductor is formed by forming a through hole for the penetrating conductor in the ceramic green sheet for the insulating base substrate 1 according to a processing method such as punching processing using a mold or a punch or laser processing before printing and application of the metalized paste for forming the conductor 3, filling the metalized paste for the penetrating conductor in the through hole by printing means such as screen printing, and firing the metalized paste together with a molded body serving as the insulating base substrate 1. The metalized paste is produced by adding an organic binder and an organic solvent, and if necessary, a dispersant or the like to metal powder of a main component and mixing and kneading the mixture using kneading means such as a ball mill, a triple roll mill or a planetary mixer. Moreover, glass or ceramics powder may be added in compliance with a sintering behavior of the ceramic green sheet and in order to increase the strength of bonding with the insulating base substrate 1 after firing. The viscosity of the metalized paste for the penetrating conductor is adjusted to a viscosity that is ideal for filling and is generally higher than that of the metalized paste for the conductor 3 by controlling the type of an organic binder and an organic solvent and the added amount thereof. The metalized paste may contain glass and ceramics in order to increase the strength of bonding with the insulating base substrate 1.

Moreover, when the insulating base substrate 1 is made of resin, the conductor 3 is made of metal materials such as copper, gold, aluminum, nickel, chromium, molybdenum, titanium, and alloys thereof. For example, a copper foil processed in the shape of the conductor 3 is transferred onto a resin sheet made of a glass epoxy resin, the resin sheets onto which the copper foil is transferred are stacked and attached by an adhesive. Moreover, among the conductors 3, the penetrating conductor that penetrates in the thickness direction of the resin sheet may be formed by depositing a conductor paste on the side surface of the through hole that is formed in the resin sheet according to printing or plating or may be formed by filling the through hole. Further, the penetrating conductor is formed by integrating a metal foil and a metal pillar by resin molding or depositing the metal foil on the insulating base substrate 1 using sputtering, evaporation, plating, or the like.

As in the examples illustrated in FIGS. 1A to 1C, 4A to 4C, 7A to 7C, and 10A to 10C, the conductor 3 is also deposited and formed on the side surface of the hole 1*c*, and when the base substrate 1 is divided, the hole 1*c* is divided to form the notch 5*a* on which a terminal electrode is deposited, on the side surface of the wiring board to become a so-called castellation conductor. Such a conductor 3 is formed by printing and depositing the metalized paste on the side surface of the hole serving as the hole 1*c*, of the ceramic green sheet for the insulating base substrate 1 by printing means such as screen printing and firing the metalized paste together with the molded body for the insulating base substrate 1. The metalized paste is used by adjusting the added amount of the organic solvent or the like according to the dimensions of the hole 1*c* so that the metalized paste has an appropriate viscosity.

The insulating base substrate 1 is divided into individual wiring boards by cutting the insulating base substrate 1 along the intended cutting line 2 using a dicing blade, a laser cutter, or the like. Moreover, a dividing groove may be formed along the intended cutting line 2 of the insulating base substrate 1, and the insulating base substrate 1 having the dividing groove is divided into individual wiring boards along the dividing groove by applying force to an appropriate position of the insulating base substrate 1 so that the insulating base substrate 1 is convex toward one main surface side or the other main surface side. When the insulating base substrate 1 is made of ceramics, the dividing groove can be formed by pressing a cutting blade or a mold against the molded body serving as the insulating base substrate 1 or performing laser processing. Although the vertical cross-sectional shape of the dividing groove may be a V-shape, a U-shape, or a quadrangular shape, it is preferable that the dividing groove has a V-shaped vertical cross-sectional shape since stress can easily concentrate on the bottom part of the dividing groove, and the breaking can be performed easily and accurately when the insulating base substrate 1 is bent and broken along the dividing groove.

Although the depth of the dividing groove is appropriately set depending on the material of an insulating substrate, the depth is preferably set to approximately 50% to 70% of the thickness of the insulating base substrate 1. By doing so, there is provided a many-up wiring substrate in which the insulating base substrate 1 is divided satisfactorily but is not accidentally broken.

The opening width of the dividing groove is preferably set to approximately 0.01 to 1.0 mm. By doing so, the insulating base substrate 1 can be satisfactorily divided along the dividing groove, the size of each of the wiring board regions 1a is not decreased due to the influence of the area occupied by the dividing groove, and the wiring board regions 1a and the dummy region 1b are not greatly deformed when the dividing groove is formed.

When the recess part 4 is formed on one main surface of the insulating base substrate 1, and the dividing groove is open in the other main surface, it is preferable that the bottom part of the dividing groove is disposed so that the distance between the bottom part of the dividing groove and the other main surface is smaller than the distance between the bottom part of the dividing groove and the bottom surface of the recess part 4. Moreover, when the dividing groove is open in the other main surface, it is preferable that the bottom part of the dividing groove is disposed so that the distance between the bottom part of the dividing groove and one main surface is smaller than the distance between the bottom part of the dividing groove and the bottom surface of the recess part 4. Moreover, when the dividing groove is formed so as to face both main surfaces, it is preferable that the distance between the bottom parts of the dividing grooves is smaller than the distance between each of the dividing grooves and the bottom surface of the recess part 4. Due to such a configuration, it is effective in suppressing the insulating base substrate 1 from being divided between the bottom part of the dividing groove and the corner part of the bottom surface of the recess part 4.

A metal plating having excellent anti-corrosion properties, such as nickel or gold is deposited on an exposed surface of the conductor 3 to become a connection electrode or an external terminal electrode. In this way, it is possible to effectively suppress corrosion of the conductor 3 and to strengthen the bonding between the conductor 3 and an electronic component, the bonding between the conductor 3 and a bonding wire, and the bonding between the conductor 3 and a wiring conductor of an external circuit board. Moreover, a nickel plating coating having a thickness of approximately 1 to 10 μm and a gold plating coating having a thickness of approximately 0.1 to 3 μm are deposited one after another on the exposed surface of the conductor 3 by electrolytic plating or electroless plating.

The wiring board of the invention includes the insulating substrate 5, the notch 5a disposed on the side surface of the insulating substrate 5 so as to extend from one main surface of the insulating substrate 5 to halfway in the thickness direction, the conductor 3 disposed on the inner surface of the notch 5a, and the through hole 1d disposed so as to extend from the inner surface of the notch 5a to the other main surface or the side surface of the insulating substrate 5. Due to such a configuration, the plating solution can easily flow in the corner part of the notch 5a near the through hole 1d, and the plating solution is suppressed from remaining in the corner part of the notch 5a. Thus, the plating solution can easily circulate in the corner part formed between the side surface and the bottom surface of the notch 5a so as to be close to the center of the wiring board, and the plating coating can be deposited on the surface of the conductor 3 to a desired thickness near the through hole 1d among the conductors 3 disposed on the side surface of the notch 5a.

Moreover, in the configuration of the wiring board of the invention, the opening of the through hole 1d of the notch 5a is disposed in the inner surface of the notch 5a so as to be close to the center of the wiring board, the plating solution in the corner part formed between the side surface and the bottom surface of the notch 5a so as to be close to the center of the wiring board can easily flow when the wiring board is immersed in the plating solution. Therefore, it is effective in forming the plating coating near the corner part formed between the side surface and the bottom surface of the notch 5a near the center of the wiring board to a desired thickness.

Moreover, in the configuration of the wiring board of the invention, when the through hole 1d has a linear form in the thickness direction of the insulating substrate 5, the plating solution can easily pass through the through hole 1d and it is difficult for the plating solution to remain in the notch 5a when the insulating substrate 5 is immersed in the plating solution as compared to when the through hole 1d is bent. Thus, it is effective in forming the plating coating to a uniform thickness.

Moreover, in the configuration of the wiring board of the invention, when the opening of the through hole 1d is disposed in the inner surface of the notch 5a so as to be along the corner between the side surface and the bottom surface of the notch 5a, since the plating solution can easily flow in the corner part formed between the side surface and the bottom surface, it is effective in making the plating solution difficult to remain in the notch 5a.

Such a wiring board of the invention can be produced by dividing the same many-up wiring substrate as the examples illustrated in FIGS. 1A to 1C, 4A to 4C, 7A to 7C, and 10A to 10C, for example.

In particular, as in the examples of FIGS. 13A, 13B, 14A, 14B, 15A and 15B, it is preferable that the through hole 1d has a linear form so as to extend from a central side of the bottom surface of the notch 5a to the bottom surface of the recess part 4 that is formed on the other main surface of the insulating substrate 5. With such a configuration, since it is possible to decrease the length of the through hole 1d, it is effective in making the plating solution flow easily.

Moreover, the through hole 1d may be disposed so as to extend from at least one of the bottom surface of the notch 5a so as to be close to the center of the insulating substrate 5 and the bottom surface of the side surface so as to be close to the center of the insulating substrate 5 to the side surface of the recess part 4 or the side surface of the insulating substrate 5. When the opening of the through hole 1*d* is disposed in the side surface of the recess part 4, if the through hole 1*d* is bent in the insulating substrate 5, it is effective in suppressing a brazing material from entering into the recess part 4 when a brazing material such as solder is filled in the notch 5*a*. Moreover, when the opening of the through hole 1*d* is disposed in the side surface of the insulating substrate 5, since a hole connected to the outside is not disposed in the other main surface, it is effective in increasing airtightness when an electronic component element is mounted on the other main surface and is sealed using a cap-shaped lid 6 or the like.

Moreover, the conductor 3 may be formed on the inner surface of the through hole 1*d*. In such a case, when a brazing material such as solder is filled in the hole 1*c*, the brazing material can also be filled in the through hole 1*d*. In this way, when a brazing material is filled in the through hole 1*d*, it is effective in increasing the strength of the bonding between the brazing material and the hole 1*c*.

Figure 16A:
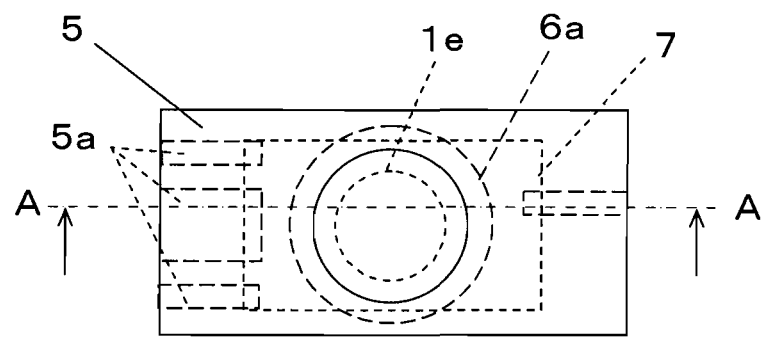
FIG. 16A is a plan view illustrating an example of an embodiment of an imaging apparatus according to the invention.
Figure 16B:
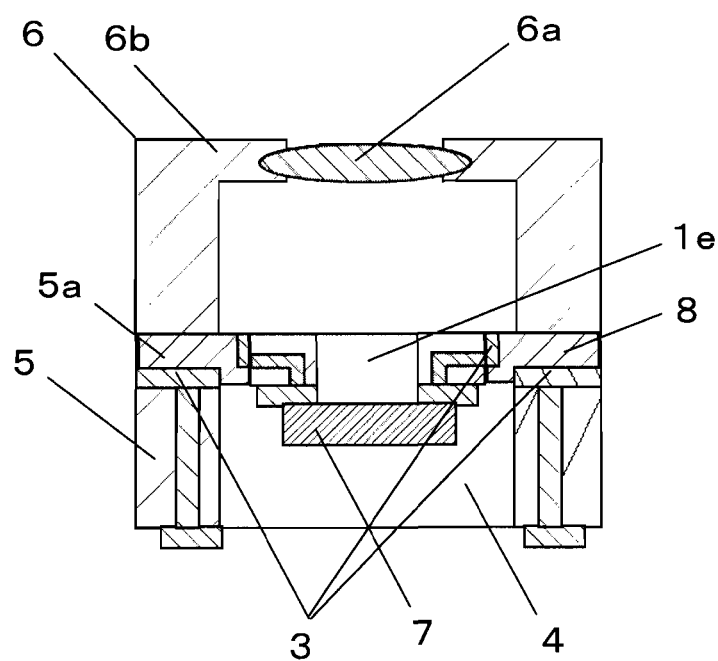
FIG. 16B is a cross-sectional view taken along the line A-A.

As in the example illustrated in FIGS. 16A and 16B, since the electronic device of the invention includes the wiring board, the electronic component element 7 mounted on the wiring board, and the lid 6 disposed on the wiring board so as to cover the electronic component element 7, the plating coating having a desired thickness is deposited on the surface of the conductor 3. Thus, it is possible to increase the strength of the bonding between the electronic device and an external circuit board.

In the above configuration of the electronic device of the invention, when the bonding material 8, which bonds the wiring board and the lid 6, is spreaded from a position between the wiring board and the lid 6 to the through hole 1*d*, since the bonding material 8 is filled in the notch 5*a*, it is effective in increasing the strength of the bonding between the wiring board and the lid 6.

When the electronic component is a flip chip-type semiconductor device, for example, the mounting of the electronic component is performed by electrically and mechanically connecting the electrodes of the semiconductor device and the conductors 3 via solder bumps or gold bumps, or a bonding material such as a conductive resin (an anisotropic conductive resin or the like). Moreover, after the electronic component is bonded to an electronic component mounting region by a bonding material, an underfill may be injected between the electronic component and the wiring board. Alternatively, when the electronic component is a wire bonding-type semiconductor device, for example, the electronic component is fixed to an electronic component mounting region by a bonding material, and then, the electrodes of the semiconductor device and the conductors 3 are electrically connected via bonding wires. Further, when the electronic component is a piezoelectric device such as a crystal vibrator, for example, fixing of the piezoelectric device and electrical connection between the electrodes of the piezoelectric device and the conductors 3 is realized by a bonding material such as a conductive resin. Further, a second electronic component such as a resistor element or a capacitor element may be mounted around the electronic component as necessary.

The electronic device of the invention is an imaging apparatus in which the imaging device 7 is mounted as the electronic component element 7, for example. As in the example illustrated in FIGS. 16A and 16B, the imaging apparatus includes the imaging device 7 mounted on the wiring board and the cap-shaped lid 6 which is disposed on the wiring board so as to cover the imaging device 7 and which has the transparent part 6*a* on an upper surface thereof, in which the side wall 6*b* of the lid 6 is disposed so as to overlap the notch 5*a* in a plan view, and the wiring board and the lid 6 are bonded together. Due to such a configuration, since the bonding material 8 which bonds the wiring board and the lid 6 is filled in the through hole 1*d* of the wiring board, it is possible to increase the strength of the bonding between the wiring board and the lid 6. In the example illustrated in FIGS. 16A and 16B, the wiring board has a configuration in which the recess part 4 is disposed in the other main surface of the insulating substrate 5, and a third through hole 1*e* is disposed in the bottom surface of the recess part 4. Moreover, the imaging device 7 has a configuration in which a light receiving part is disposed in the third through hole 1*e* so as to face the transparent part 6*a* and is mounted in the recess part 4 in a plan view.

The invention is not limited to the examples of the above-described embodiments, and various changes can be made without departing from the spirit of the invention. For example, in the many-up wiring substrate of the examples illustrated in FIGS. 1A to 1C, 4A to 4C, 7A to 7C, and 10A to 10C, although an example in which the wiring board regions 1*a* are arranged to be adjacent to each other has been described, the dummy region 1*b* may be arranged around each of the wiring board regions 1*a*. In such a case, it is preferable that the hole 1*c* is disposed so as to extend straddling the wiring board region 1*a* and the dummy region 1*b* around the wiring board region 1*a*, and the through hole 1*d* is disposed in the wiring board region 1*a* and the dummy region 1*b*. By doing so, it is made difficult for the plating solution is to remain in the hole 1*c*. Such a dummy region is formed when an asymmetrical notch is formed in the wiring board region 1*a*. In such a case, it is preferable that the through hole 1*d* is disposed in both the wiring board region 1*a* and the dummy region 1*b*. By doing so, the plating solution can easily flow.

REFERENCE SIGNS LIST

1: Insulating base substrate
1*a*: Wiring board region
1*b*: Dummy region
1*c*: Hole
1*d*: Through hole
1*e*: Third through hole
2: Intended cutting line
3: Conductor
4: Recess part
5: Insulating substrate
5*a*: Notch
6: Lid
6*a*: Transparent part
6*b*: Side wall
7: Electronic component element (imaging device)
8: Bonding material

The invention claimed is:

1. A wiring board, comprising:
an insulating substrate including one main surface and an other main surface;
a notch disposed on a side surface of the insulating substrate so as to extend from the one main surface of the insulating substrate to halfway in a thickness direction of the insulating substrate, the notch including an inner surface;
a conductor disposed on the inner surface of the notch;

a recess part disposed in the other main surface of the insulating substrate overlapping the notch in a plan view, the recess part including an inner surface; and a through hole disposed so as to extend from the inner surface of the notch to the inner surface of the recess part.

2. The wiring board according to claim 1, wherein an opening of the through hole is disposed in the inner surface of the notch so as to be close to a center of the insulating substrate.

3. The wiring board according to claim 1, wherein the through hole has a linear form in the thickness direction of the insulating substrate.

4. The wiring board according to claim 1, wherein an opening of the through hole is disposed in the inner surface of the notch so as to be along a corner disposed between a side surface and a bottom surface of the inner surface of the notch.

5. An electronic device, comprising:
the wiring board according to claim 1;
an electronic component element mounted on the wiring board; and
a lid disposed on the wiring board so as to cover the electronic component element.

6. The electronic device according to claim 5, wherein a bonding member, which bonds the wiring board and the lid, is disposed from a position between the wiring board and the lid to the through hole.

\* \* \* \* \*